(12) United States Patent
Chen et al.

(10) Patent No.: US 7,317,239 B2
(45) Date of Patent: Jan. 8, 2008

(54) METHOD FOR MANUFACTURING A RESISTOR

(75) Inventors: Cheng-Hsiung Chen, Taipei (TW); Yue-Shiun Lee, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/308,229

(22) Filed: Mar. 14, 2006

(65) Prior Publication Data

US 2007/0034990 A1    Feb. 15, 2007

Related U.S. Application Data

(62) Division of application No. 10/711,390, filed on Sep. 15, 2004, now Pat. No. 7,105,912.

(51) Int. Cl.
*H01L 29/00*    (2006.01)
(52) U.S. Cl. ............... 257/538; 257/384; 257/380; 338/22 SD; 438/382
(58) Field of Classification Search ............. 257/538
See application file for complete search history.

(56) References Cited

U.S. PATENT DOCUMENTS

| 5,607,866 | A | 3/1997 | Sato et al. | |
| 6,620,635 | B2* | 9/2003 | Leidy | 438/14 |
| 2002/0140097 | A1 | 10/2002 | Takeshi et al. | |
| 2005/0074929 | A1 | 4/2005 | Hisashi et al. | |

* cited by examiner

*Primary Examiner*—Tu-Tu Ho
(74) *Attorney, Agent, or Firm*—Winston Hsu

(57) ABSTRACT

A method of manufacturing a resistor is provided. At first, a semiconductor layer including at least a high resistance region and a low resistance region is formed on a substrate. Following that, a first ion implantation process is performed to the entire surface of the semiconductor layer, and a second ion implantation process is performed to the portions of the semiconductor layer within a predetermined region, so that the semiconductor layer has a higher doping concentration within the predetermined region than in the other regions. Therein, the predetermined region overlaps the low resistance region, the junction between the low resistance region and the high resistance region, and the portions of the high resistance region adjacent to the junction between the low resistance region and the high resistance region.

4 Claims, 4 Drawing Sheets

METHOD FOR MANUFACTURING A RESISTOR

CROSS REFERENCE TO RELATED APPLICATIONS

This application is a division of applicant's earlier application, Ser. No. 10/711,390, filed Sep. 15, 2004, now U.S. Pat. No. 7,105,912, the entirety of which is incorporated by reference.

BACKGROUND OF THE INVENTION

1. Field of the Invention

The present invention relates to a method for manufacturing a resistor, and more particularly, to a method for manufacturing a resistor having low end-resistance.

2. Description of the Prior Art

In a semiconductor process, semiconductor materials, such as polysilicon, are often positioned to function as resistors capable of providing high resistance. These resistors can be used in place of load transistors. When load transistors of a static random access memory (SRAM) is replaced by semiconductor resistors, the number of transistors in the SRAM can be reduced and thus saves cost and enhance the integration of the SRAM.

Conventionally used semiconductor resistors can be divided into polysilicon resistors and diffusion resistors. A polysilicon resistor is formed, for example, by forming a polysilicon film into which dopants are doped into through an insulating film on a semiconductor substrate. The resistance of the polysilicon resistor can be controlled by the dopant concentration in the polysilicon layer. A diffusion resistor is formed, for example, by doping dopants into a semiconductor substrate to form a diffusion layer, and then by using a thermal diffusion method to activate the dopants in the diffusion layer and adjust the resistance thereof. Normally, the resistor, no matter it is a polysilicon resistor or a diffusion resistor, has a sandwich-like structure that sandwiches a high resistance region between two low resistance ends. The low resistance ends are provided for forming interconnection contact plugs to connect the resistor with other wirings. The high resistance region is used to provide a high resistance to satisfy circuit designs or device demands.

With the development of the various electronic products, circuit designs applying load resistors become more and more complicated. For example, for the analog/digital mixed mode integrated circuits or the radio frequency integrated circuits, it is required that the load resistors have a high value of ohmic resistance and the value of the ohmic resistance must further be within tight limits. However, the conventional semiconductor resistor structure has high end-resistance in the vicinity of the junction between the high resistance region and the low resistance region. As a result, a linearity relationship between characteristic parameters, such as resistance, temperature coefficients and voltage coefficients, and structure parameters, such as a length and a width of the resistor structure, is affected by the high end-resistance of the resistor. In this case, it becomes more difficult to calculate an accurate value of the resistance and provide a stable value of high resistance, thus decreasing yields of the products.

SUMMARY OF THE INVENTION

It is therefore an object of the claimed invention to provide a method for manufacturing resistor to provide stable high resistance.

According to the claimed invention, the method of manufacturing a resistor includes forming a semiconductor layer on a substrate, the semiconductor layer including at least a high resistance region and a low resistance region. Following that, a first ion implantation process is performed to the entire surface of the semiconductor layer, and a second ion implantation process is performed to the portions of the semiconductor layer within a predetermined region, so that the semiconductor layer has a higher doping concentration within the predetermined region than in the other regions. Therein, the predetermined region overlaps the low resistance region, the junction between the low resistance region and the high resistance region, and the portions of the high resistance region adjacent to the junction between the low resistance region and the high resistance region.

It is an advantage of the present invention that the doping concentration in the vicinity of the junction between the high resistance region and the low resistance region is increased to reduce the end-resistance of the resistor structure. Therefore, problems such as unstable resistance resulted from the doping concentration variation as occurred in the vicinity of the junction between the high resistance region and the low resistance region in the prior art resistor structure can be effectively prevented. A stable high resistance is thus provided to improve yields of the products according to the present invention.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
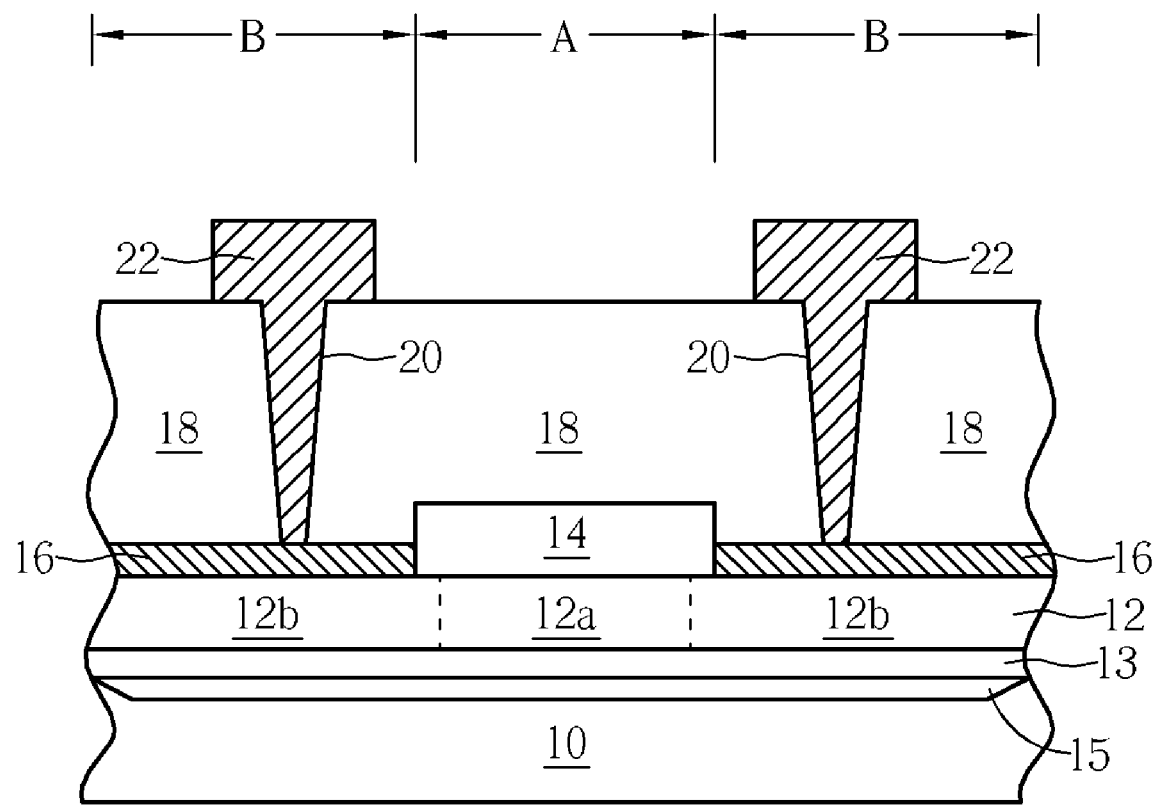
FIG. 1 is a cross-sectional diagram of a resistor structure according to the present invention.

Referring to FIG. 1, FIG. 1 is a cross-sectional diagram of a resistor structure according to the present invention. As shown in FIG. 1, the resistor structure includes a substrate 10, and a semiconductor layer 12 positioned on the substrate 10. The semiconductor layer 12 has a high resistance region A and at least a low resistance region B positioned at either side of the high resistance region A. In order to prevent problems of unstable resistance from occurring in the vicinity of the junction between the high resistance region A and the low resistance region B, the semiconductor layer 12 has a lightly doped region 12a formed within the high resistance region A, and at least a heavily doped region 12b overlapping the low resistance region B, the junction between the high resistance region A and the low resistance region B, and the portions of the high resistance region A adjacent to the junction between the high resistance region A and the low resistance region B. The semiconductor layer 12a and the semiconductor layer 12b positioned at either end of the semiconductor layer 12 are formed with the same type of dopants but have different doping concentrations. For example, the semiconductor layer 12a is formed of n– dopants to provide a high resistance, and the semiconductor layer 12b is formed of n+ dopants to provide a lower resistance for forming interconnection contact plugs to electrically connect the resistor to other wirings. Alternatively, the semiconductor layer 12a is formed of p− dopants and the semiconductor layer 12b is formed of p+ dopants.

In other embodiments of the present invention, the semiconductor layer 12b may further have a gradually varying doping concentration distribution to prevent problems of unstable resistance from occurring in the vicinity of the junction between the high resistance region A and the low resistance region B. For example, the ends of the semiconductor layer 12b for forming the interconnection plugs may have a higher doping concentration to reduce the resistance. As for the portions of the semiconductor layer 12b in the vicinity of the junction between the low resistance B and the high resistance A, it may have a lower doping concentration than that at the ends of the semiconductor layer 12b. The portions of the semiconductor layer 12b having the lower doping concentration overlap the portions of the low resistance region B and the high resistance region A that are adjacent to the junction between the low resistance region B and the high resistance region A. In addition, the lower doping concentration of the semiconductor layer 12b should be higher than the doping concentration of the semiconductor layer 12a within the high resistance region A.

The semiconductor layer 12 can be applied in a polysilicon resistor or a diffusion resistor according to the present invention. When being applied in a polysilicon resistor, the polysilicon layer 12 is formed of polysilicon, and a dielectric layer 13 is positioned underneath the semiconductor layer 12 to enable the semiconductor layer 12 to connect with other underneath wirings through contact plugs formed in the dielectric layer. When being applied in a diffusion resistor, the semiconductor layer 12 is a diffusion layer formed by doping dopants into the substrate 10, and an ion implantation well 15 is positioned underneath the semiconductor layer 12 depending on electrical characteristics demands of the products.

In a better embodiment of the present invention, the high resistance region A further includes a salicide block (SAB) 14 positioned on the semiconductor layer 12a and the portions of the semiconductor layer 12b adjacent to the junction between the high resistance region A and the low resistance region B. The low resistance region B further includes a salicide layer 16 positioned on portions of the semiconductor layer 12b. In addition, an inter layer dielectric (ILD) 18 is also formed on the substrate 10 to insulate the salicide layer 16 from other conductive materials. At least a contact hole 20 connecting to the salicide layer 16 is formed within the inter layer dielectric 18. At least a conductive layer 22 is formed on portions of the inter layer dielectric 18 and within the contact hole 20, thus connecting the resistor structure to wirings formed above the inter layer dielectric 18 via the conductive layer 22 filling in the contact hole 20.

Figure 2:
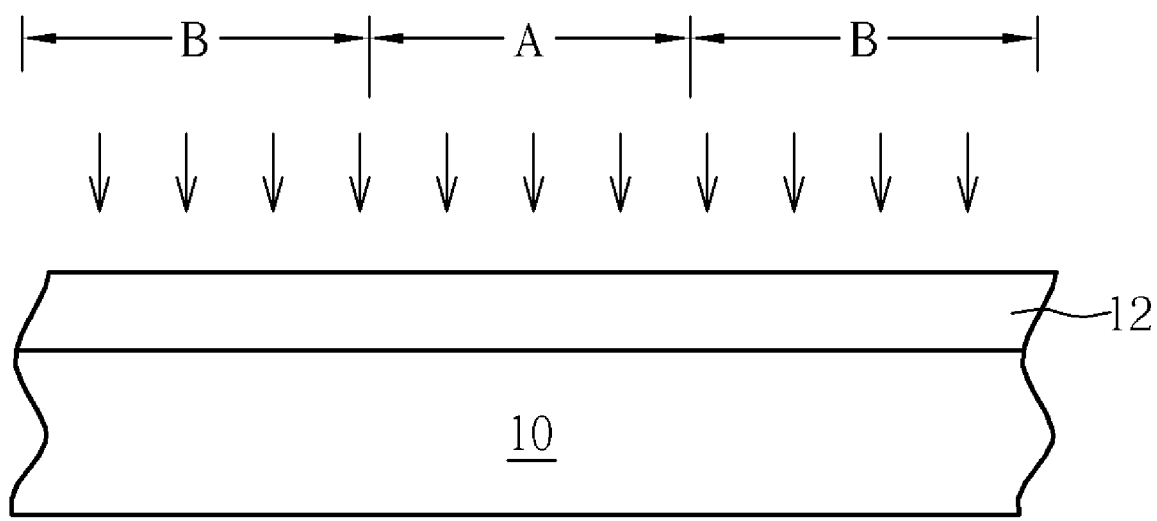
FIGS. 2-4 are schematic diagrams of a method of manufacturing a resistor according to the present invention.
Figure 3:
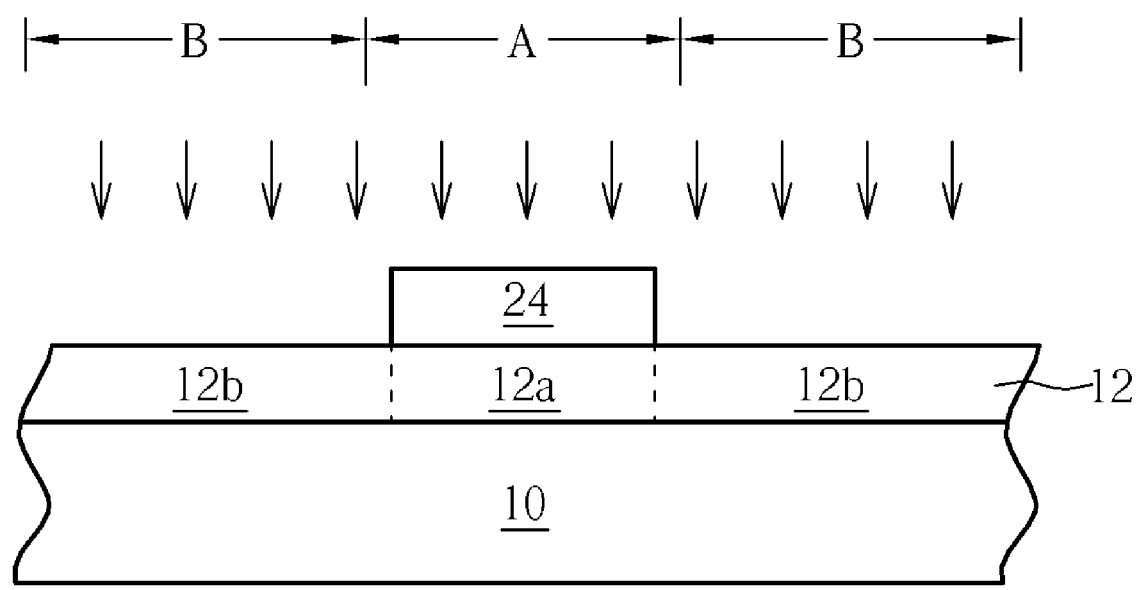
Figure 4:
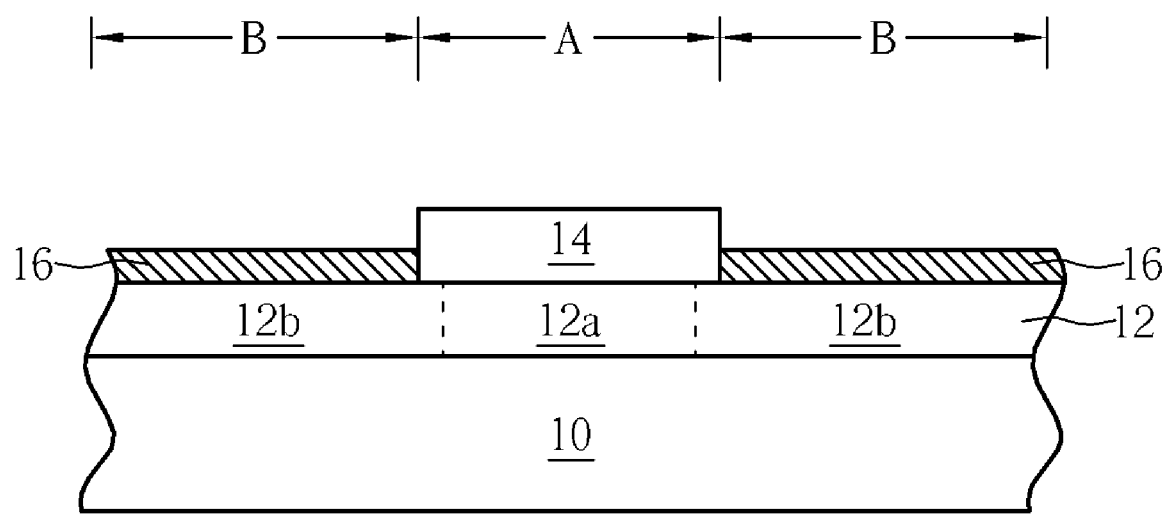

Referring to FIGS. 2-4, FIGS. 2-4 are schematic diagrams of a method of manufacturing the resistor shown in FIG. 1 according to the present invention. As shown in FIG. 2, the semiconductor layer 12 having the high resistance region A and the low resistance region B positioned at either side of the high resistance region A is formed on the substrate 10. Following that, a first ion implantation process is performed, using n or p type dopants, to implant the entire surface of the semiconductor layer 12. Subsequently, as shown in FIG. 3, a photolithographic process is performed to form a photoresist mask 24 on portions of the semiconductor layer 12 to cover portions of the high resistance region A. Following that, a second ion implantation process is performed to implant dopants of the same type as that used in the first ion implantation process into the semiconductor layer 12. After a thermal treatment to activate the semiconductor layer 12, the lightly doped region 12a is formed in the portions of the semiconductor layer 12 within the high resistance region A, and the heavily doped region 12b is formed in the portions of the semiconductor layer 12 to overlap the low resistance region B, the junction between the low resistance region B and the high resistance region A, and the portions of the high resistance region A adjacent to the junction between the low resistance region B and the high resistance region A.

As shown in FIG. 4, after the removal of the mask 24, the salicide block 14 is formed on the semiconductor layer 12a and the portions of the semiconductor layer 12b within the high resistance region A. Using the salicide block 14 as a mask, the salicide layer 16 is formed on the portions of the semiconductor layer 12b within the low resistance region B to reduce the end-resistance of the semiconductor layer 12b. Subsequently, the inter layer dielectric 18, such as a silicon oxide layer or a borophosphosilicate glass (BPSG), is formed on the surface of the substrate 10 to insulate the salicide layer 16 from other conductive materials. Following that, a photolithographic process and an etching process are performed to form the contact hole 20 in the inter layer dielectric 18 to connect to the salicide layer 16. The conductive layer 22 is then formed on portions of the inter layer dielectric 18 and within the contact hole 20, thus connecting the resistor to wirings formed above the inter layer dielectric 18 via the conductive layer 22 filling in the contact hole 20.

In contrast to the resistor structure of the prior art, the present invention increases the doping concentration in the vicinity of the junction between the high resistance region and the low resistance region, thus reducing the end-resistance by 1-2 orders of magnitude. Therefore, problems such as unstable resistance resulted from the doping concentration variation as occurred in the vicinity of the junction between the high resistance region and the low resistance region in the prior art resistor structure can be effectively prevented. A uniform and stable value of high resistance is therefore obtained to satisfy the high resistance requirements for the SRAM, analog, digital/analog mixed mode and radio frequency circuit designs as well as to improve yields of the products according to the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a resistor comprising:
providing a substrate;
forming a semiconductor layer on the substrate, the semiconductor layer comprising at least a high resistance region and a low resistance region;
performing a first ion implantation process to the entire surface of the semiconductor layer;
performing a second ion implantation process to implant dopants of the same type as that used in the first ion implantation process into the semiconductor layer to form a predetermined region, having a higher doping concentration than in the other regions; and
performing a thermal treatment;
wherein the predetermined region comprises the low resistance region, the junction between the low resistance region and the high resistance region, and the portions of the high resistance region adjacent to the junction between the low resistance region and the high resistance region.

2. The method of claim 1 further comprising:
   forming a salicide block on the portions of the semiconductor layer within the high resistance region; and
   forming a salicide layer on the portions of the semiconductor layer within the low resistance region.

3. The method of claim 2 wherein the predetermined region overlaps the salicide layer, the junction between the salicide layer and the salicide block, and the portions of the salicide block adjacent to the junction between the salicide layer and the salicide block.

4. The method of claim 1 further comprising:

forming an inter layer dielectric on the substrate, the inter layer dielectric comprising at least a contact hole connecting to the portions of the semiconductor layer within the low resistance region; and forming a conductive layer on portions of the surface of the inter layer dielectric and within the contact hole.

\* \* \* \* \*